United States Patent [19]
Fowler et al.

[11] Patent Number: 5,801,657
[45] Date of Patent: Sep. 1, 1998

[54] SERIAL ANALOG-TO-DIGITAL CONVERTER USING SUCCESSIVE COMPARISONS

[75] Inventors: Boyd Fowler, Sunnyvale; David Yang, Stanford; Abbas El Gamal, Palo Alto, all of Calif.

[73] Assignee: Stanford University, Palo Alto, Calif.

[21] Appl. No.: 795,497

[22] Filed: Feb. 5, 1997

[51] Int. Cl.⁶ .................................................. H03M 1/38
[52] U.S. Cl. ........................................... 341/155; 341/161
[58] Field of Search .................................. 341/155, 159, 341/161; 327/104, 65, 563

[56] References Cited

U.S. PATENT DOCUMENTS 5,461,425 10/1995 Fowler et al. ........................ 348/294
5,684,419 11/1997 Murden et al. ....................... 327/104

*Primary Examiner*—Brian K. Young
*Attorney, Agent, or Firm*—Skjerven, Morrill, MacPherson, Franklin & Friel; Brian D. Ogonowsky

[57] ABSTRACT

A method for simultaneously performing bit serial analog to digital conversion (ADC) for a potentially very large number of signals is described. The method is ideally suited for performing on chip ADC in area image sensors. In one embodiment, to achieve N-bit precision, the method employs a one-bit comparator per channel (or set of multiplexed channels) and an N-bit DAC. To achieve N bits of precision, $2^N-1$ comparisons are sequentially performed. Each comparison is performed by first setting the DAC output to the desired value and then simultaneously comparing each of the pixel values to that value. If a pixel value is greater than the DAC output value, its comparator outputs a one, otherwise it outputs a zero. By appropriately choosing the sequence of comparison values, the pixel values are sequentially generated. In another embodiment, the DAC is omitted and a continuous ramp signal is generated for comparison with the analog input.

20 Claims, 11 Drawing Sheets

SERIAL ANALOG-TO-DIGITAL CONVERTER USING SUCCESSIVE COMPARISONS

FIELD OF THE INVENTION

This invention relates to analog-to-digital converters and, in particular, to analog-to-digital converters which generate a serial string of bits.

BACKGROUND

In many digital imaging applications, it is desirable to integrate analog-to-digital conversion (ADC) with an area image sensor, as described in U.S. Pat. No. 5,461,425, entitled CMOS Image Sensor With Pixel Level A/D Conversion, by Boyd Fowler et al., incorporated herein by reference. Such integration helps lower system cost and power consumption. Among the different schemes for integrating the ADC with an area image sensor, pixel level ADC promises to achieve the lowest power, and the simplest, most process portable and scalable design. The ADC approach described in U.S. Pat. No. 5,461,425 is based on first order sigma delta modulation which has the advantage of requiring fairly simple and robust circuits, but the disadvantage of producing too much data due to oversampling. In addition, this approach suffers from poor low light performance.

What is needed is an improved A/D conversion method which is well suited to pixel level implementation and overcomes the above-described limitations of the prior art.

SUMMARY

A method for simultaneously performing bit serial analog-to-digital conversion (ADC) for a potentially very large number of signals is described. The method is ideally suited for performing on chip ADC in area image sensors. In one embodiment, to achieve N-bit precision, the method employs a one-bit comparator per channel (or set of multiplexed channels) and an N-bit digital-to-analog converter (DAC). The one bit comparator can be integrated within each pixel location or shared among a few neighboring pixels in an area image sensor. The N-bit DAC can be placed external to the sensor array. To achieve N bits of precision, $2^N-1$ comparisons are sequentially performed. Each comparison is performed by first setting the DAC output to the desired value and then simultaneously comparing each of the pixel values to that value. If a pixel value is greater than the DAC output value, its comparator outputs a one, otherwise it outputs a zero. By appropriately choosing the sequence of comparison values, the pixel values are sequentially generated.

In another embodiment, the DAC is omitted and a continuous ramp is generated for comparison with the analog input.

DETAILED DESCRIPTION OF THE PREFERRED EMBODIMENTS

Figure 1A:
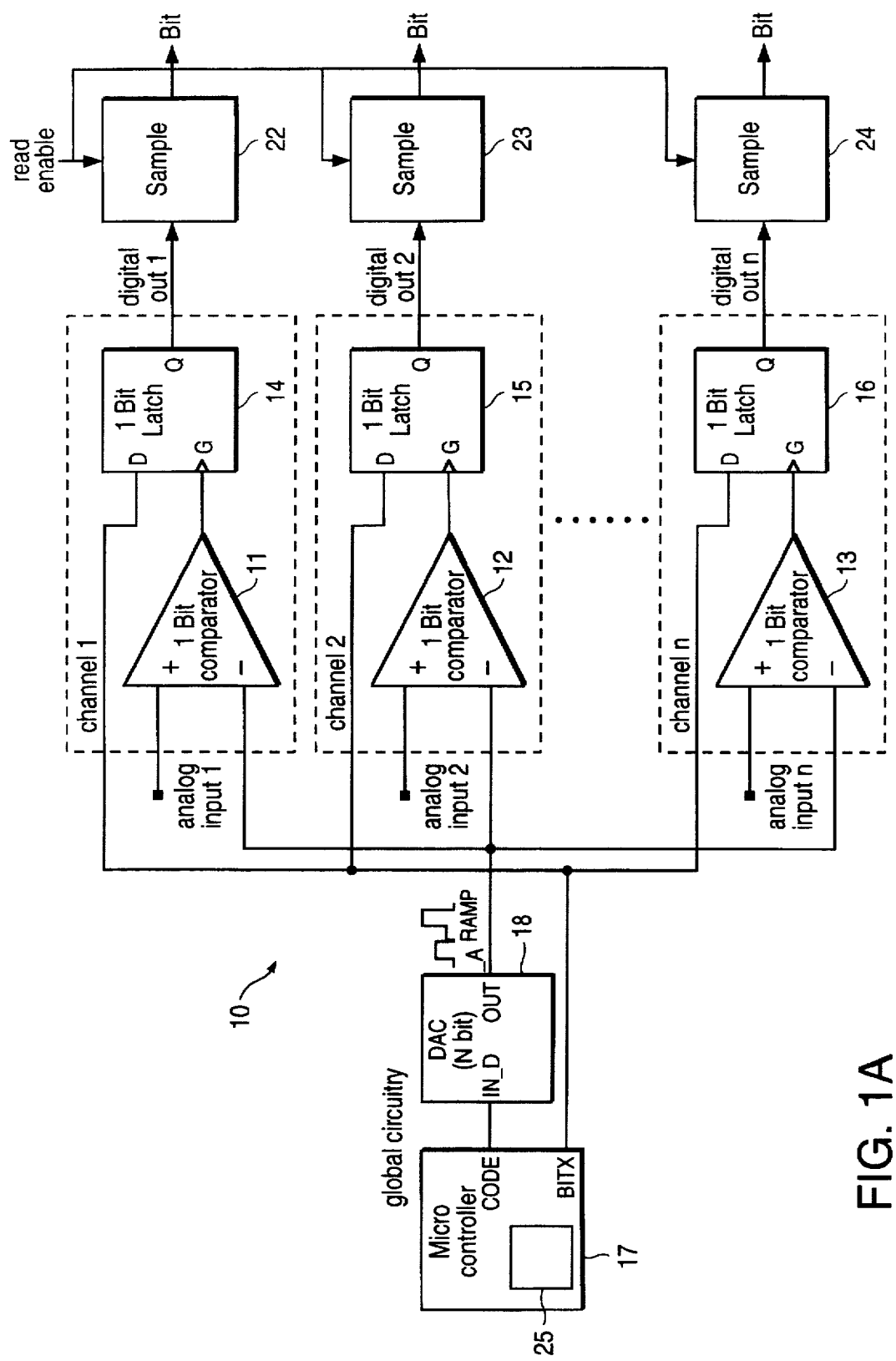
FIG. 1A illustrates a multi-channel bit serial A/D converter incorporating global circuitry and circuitry associated with each channel, in accordance with one embodiment of the invention.

A block diagram of an n channel, N-bit Multi-Channel Bit Serial (MCBS) ADC 10 is depicted in FIG. 1A. Each channel comprises a one-bit comparator 11–13 and a one-bit latch 14–16. The shared circuitry between channels comprises a controller 17 and an N-bit DAC 18. Controller 17 may be a state machine, a programmed microprocessor, or any other circuit for generating a series of codes.

The MCBS ADC 10 performs the A/D conversion as follows. To simplify notation we assume that the range of the analog signal values (e.g., from photodetectors) is the unit interval (0,1). Thus to quantize an analog signal to N-bits of precision, the unit interval is partitioned into $2^N$ subintervals $$\left(\frac{i}{2^N}, \frac{(i+1)}{2^N}\right],$$

$0 \leq i \leq 2^N-1$, and each subinterval is represented by a unique N-bit codeword. An N=3 example is given in Table 1.

TABLE 1

| Input/Output of three-bit ADC Three Bit MCBS ADC Code | | |
|---|---|---|
| D/A Converter Input | Binary Code | Gray Code |
| 0 to 1/8 | 0 0 0 | 0 0 0 |
| 1/8 to 2/8 | 0 0 1 | 0 0 1 |
| 2/8 to 3/8 | 0 1 0 | 0 1 1 |
| 3/8 to 4/8 | 0 1 1 | 0 1 0 |

TABLE 1-continued

Input/Output of three-bit ADC
Three Bit MCBS ADC Code

| D/A Converter Input | Binary Code | Gray Code |
|---|---|---|
| 4/8 to 5/8 | 1 0 0 | 1 1 0 |
| 5/8 to 6/8 | 1 0 1 | 1 1 1 |
| 6/8 to 7/8 | 1 1 0 | 1 0 1 |
| 7/8 to 1 | 1 1 1 | 1 0 0 |

In this example we use a Gray code to represent the quantized signal output from the ADC because of its robustness against signal errors that may occur in the operation of the ADC 10. To find the N-bit digital codewords of the signals, the MCBS ADC performs a sequence of N binary questions of the form: Is signal S within a subinterval range A (i.e., S∈E A?). This question is asked for all eight of the subintervals in Table 1. The answer to each question corresponds to one bit of precision. Each question is broadcast to all channels and, thus, all digital signal values are generated simultaneously, one bit at a time.

The order in which the sequence of questions are asked is arbitrary. Thus for example the questions may be asked such that the MSB is produced first followed by the second MSB and so on, or may be asked in the reverse order to produce the LSB first, followed by the second LSB, ... etc. The set of binary questions can be easily determined from any given code as follows. The codewords (e.g., Gray code) are listed in order of increasing subinterval index i, as shown in Table 1. Thus the first codeword corresponds to i=0, the second to i=1, and the last to i=$2^N$-1. For each bit position of the digital output of the ADC, the set of subintervals to be compared to the analog signal S is the union of the subintervals whose codewords have a one in that bit position. For example, the list of questions for the N=3 example are: 1) is S in the range of ½ to 1 for the leftmost bit (bit2); 2) is S in the range of ¼ to ¾ for the middle bit (bit1); and 3) is S in either the range of ⅛ to ⅜ or ⅝ to ⅞ for the rightmost bit (bit0).

The MCBS ADC 10 implements each binary question by performing a set of binary comparisons between the signal RAMP (FIG. 2), broadcast by the DAC 18 to all comparators, and the set of analog signal values, where $$RAMP \in \left\{ \frac{1}{2^N}, \frac{2}{2^N}, \dots \frac{(2^N-1)}{2^N} \right\}.$$

If S>RAMP, the output of the comparator (e.g., comparator 11) is a 1, otherwise it is a 0. The values of RAMP used in the comparisons are determined from a given code as follows. The set of codewords are again listed in the order of increasing subinterval index i. For each bit position k, the codewords are scanned to determine the ordered set of indices i, denoted by $B_k$, such that either codeword i has a 0 in that position and codeword i−1 has a 1, or codeword i has a 1 in that position and codeword i−1 has a 0. The set of RAMP values for bit position k is the ordered set of values $$\left[ \frac{i}{2^N} : i \in B_k \right].$$

Figure 2:
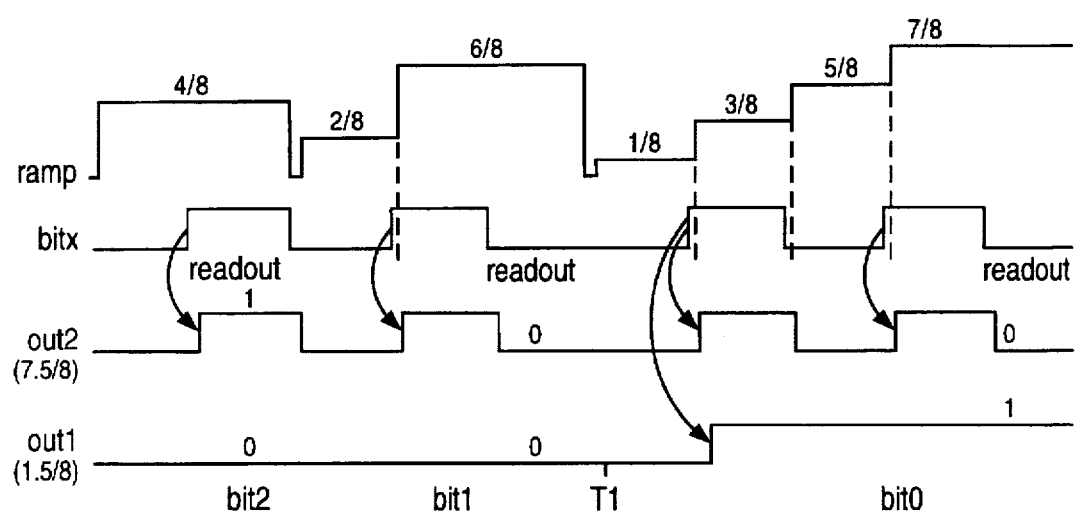
FIG. 2 is a time line illustrating the various signal values generated in FIG. 1A.

For the N=3 example illustrated in FIG. 2, the set of RAMP values are ½ for bit2, ¼ and ¾ for bit1, and ⅛, ⅜, ⅝ and ⅞ for bit0. This ordering of RAMP values corresponds to the 1's in the three bit positions shown in Table 1.

From the construction of the $B_k$ sets it can be shown that the total number of comparisons needed to achieve N bits of precision must be at least $2^N$−1. For the Gray code, this lower bound is achieved since each two consecutive codewords differ in exactly one bit position. Thus, in addition to its robustness against errors, the Gray code has the important advantage of minimizing the number of binary comparisons needed. Of course any other code with the unit distance property would have the same advantages as the Gray code.

To explain how each set of comparisons creates a bit in the Gray code, refer to the waveforms for the case N=3 shown in FIG. 2. The set of binary comparisons is preferably performed in the order of increasing RAMP value. The signal BITX from controller 17 is a global clock signal connected to the D inputs of the latches 14–16. The value of RAMP can change every half cycle of BITX. Each comparator 11–13 output is connected to the G input of its respective latch 14–16. When the G input is high, the output of latch 14–16 follows the BITX signal. When the G input is low, the latch 14–16 remains in its previous state.

Consider the set of comparisons for the LSB (bit0). The RAMP signal value starts at ⅛, steps to ⅜ at the next BITX transition, then to ⅝ and finally to ⅞. For any analog signal value, there can be at most one transition from 1 to 0 at the output of the comparator 11–13 per N-bit code. For example, for signal 1 with value of 1.5/8, the transition from 1 to 0 at time T1 occurs when RAMP steps to 3/8, while for signal 2 with value 7.5/8 no transition occurs. The output of the latch 14–16 is the last value of BITX before the comparator 11–13 transitions. Thus it is a 1 for signal 1 at bit 0 after the transition of the comparator from 1 to 0, since BITX was a 1 prior to the transition.

A sampling circuit 22–24 in FIG. 1A connected to the output of each latch 14–16 receives a read enable signal at the end of each bit period to sample the output of latch 14–16 and provide the output bit value numerically identified in FIG. 2.

From FIG. 2, the conversion time of MCBS ADC 10 is given by $$\frac{1}{2} \times T_{BITX} \times (2^N - 1) + N \times T_{readout}.$$

where $T_{BITX}$ is the period of BITX during the comparison phase, and $T_{readout}$ is the time required to read the data. The period of BITX is a function of the comparator 11–13 switching time, which further depends on the bit resolution N of the ADC 10 under a fixed supply voltage. For a fixed comparator gain-bandwidth, the period of BITX grows as $2^N$. Therefore, the conversion time is roughly proportional to $4^N$. If the conversion time is kept constant, the required gain-bandwidth of the comparator grows as $4^N$. The conversion time of our MCBS ADC 10 is comparable to that of a single slope or ramp counter type ADC.

Figure 1B:
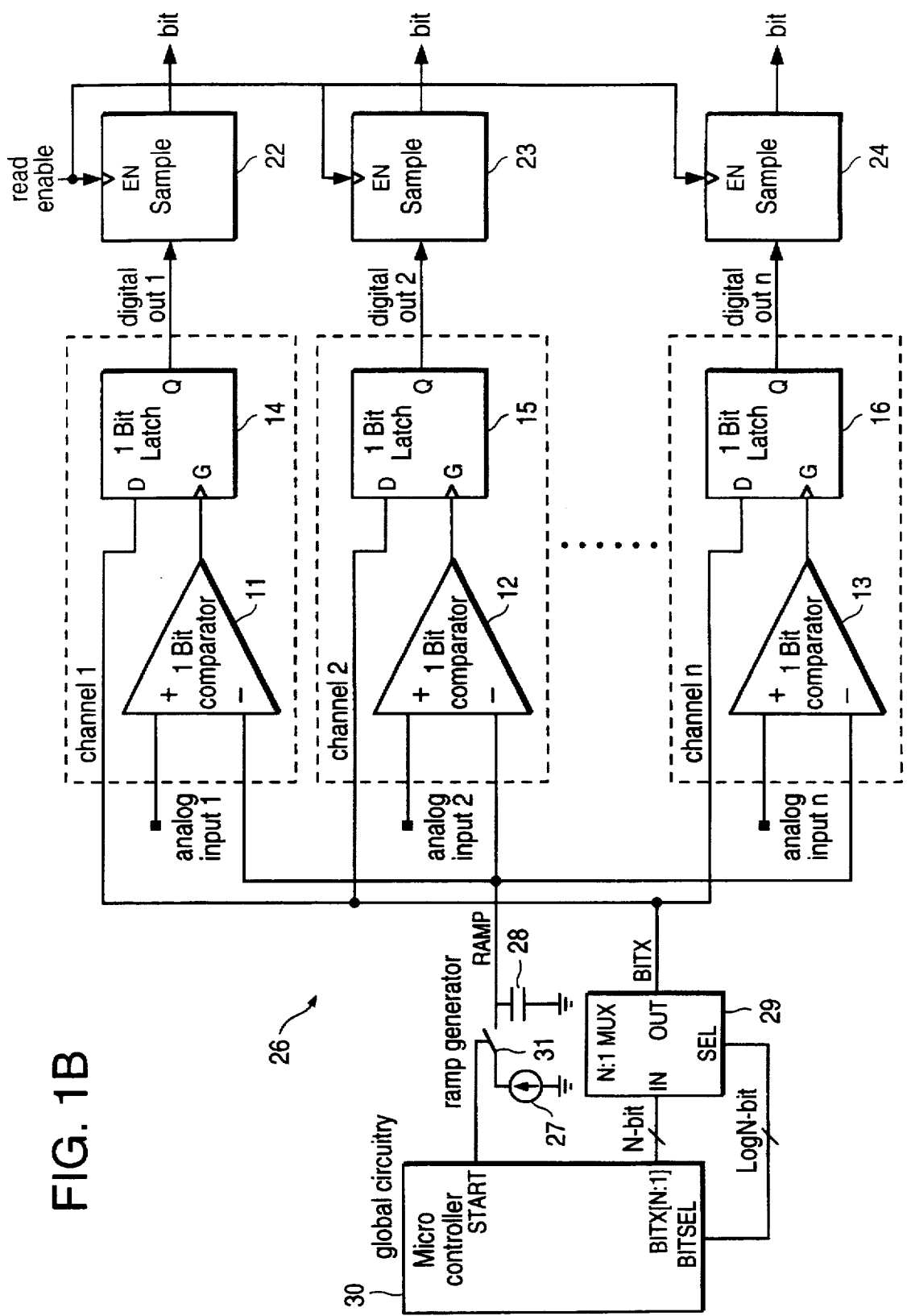
FIG. 1B illustrates the circuit of FIG. 1A but with different global circuitry.

FIG. 1B illustrates a modification to the A/D converter of FIG. 1A. The ADC 26 of FIG. 1B differs from ADC 10 of FIG. 1 only in the global control circuitry. The main advantage of this scheme is that a DAC is not needed. Instead, we only need a current source 27 that charges a capacitor 28 for a period of time to generate the signal RAMP. In other words, RAMP now is a continuous ramp signal instead of the discrete signal shown in FIG. 2. RAMP increases from zero to the anticipated maximum analog input level. (Note that the preferred implementation, shown in FIGS. 8 and 10, uses a CMOS process and the inputs into comparators 11–13 are PMOS transistors. This accounts for the + and − input designations on comparators 11–13 in FIGS. 1A and 1B being apparently reversed.) Just like the ADC 10 described earlier, this new scheme performs a sequence of N binary questions of the form:Is signal S ∈A? However, to implement each binary question, since RAMP signal is a continuous ramp, the signal BITX is no longer periodic. Instead, BITX is the bit sequence of all the codewords at a particular bit position. For example, in a 3-Bit Gray code example, to resolve the leftmost bit, BITX sequences through 0-0-0-0-1-1-1-1; to resolve the middle bit, BITX sequences through 0-0-1-1-1-1-0-0; to resolve the rightmost bit, BITX sequences through 0-1-1-0-0-1-1-0. The signal RAMP begins again for each bit position. The value of BITX occurring when RAMP crosses the analog input level is provided as the output bit for the particular bit position 0, 1, or 2.

BITX may be generated in many ways. In FIG. 1B, the possible bits (e.g., 01100110) for a bit position are applied to the input of an N:1 multiplexer 29. A (logN)-bit signal (e.g., 3 bits) is applied to the control terminal of multiplexer 29 to select one of the inputs for the BITX signal for a particular bit position. A microcontroller 30, which may be a state machine, a microprocessor, or any other suitable logic circuit, generates the signals applied to multiplexer 29 and the control signal for switch 31. This technique of using a continuous RAMP signal may be applied to all other ADC's described herein.

Although this scheme obviates the need for a DAC, the conversion time increases by at least a factor of N when compared with the ADC 10. This new scheme can also perform ADC with non-uniform quantization steps or analog pre-processing; however, the conversion time will be much longer, and special timing logic is needed to generate BITX (e.g., with a much higher speed internal clock).

The conversion time of this new scheme could be reduced when multislope ramp signals are used; however, the comparator speed required increases exponentially and, hence, may be undesirable. Also, this scheme and the ADC 10 might be combined so that some binary questions are asked by the DAC and the others asked by the ramp signal. This is useful when the DAC does not have a high enough resolution. However, this requires a very linear DAC and precise calibration.

We have described the operation of the MCBS ADC 10 for a fixed length code (e.g., N=3). The MCBS ADC 10 can be used to perform data compression on the signals simultaneous with digitization by using an appropriate variable length code such as a Huffman code generated using the statistics of the signals. For a variable length code, the generation of the set of binary questions and the corresponding sets of binary comparisons can be done in the same manner as for a fixed length code. The codewords are appropriately 'padded' by extra ones and zeros so that all codewords have the same length. The choice of the padding is done to minimize the number of comparisons needed.

Up to this point we have been assuming uniform signal quantization, where all the subintervals have equal lengths. To perform companding, such as for Gamma correction or compression, it may be desirable to use nonuniform quantization where the subintervals are of different lengths. The MCBS ADC 10 can still be used in this case, but the precision of the comparators 11–13 and DAC 18 must be increased.

The MCBS ADC 10 outputs one bit at a time from each channel. This requires a minimum of $2^N-1$ binary comparisons. Since the N questions can be asked in any order, the speed of conversion can be increased by asking multiple questions simultaneously. For example, using two comparator/latch pairs per channel, conversion time is reduced by approximately a factor of 2.

Unit-Distance Codes Particularly Suitable For Parallel Speedup

In the previous subsection, we mentioned that MCBS ADC 10 uses unit-distance coding (e.g., Gray code) because it has the important advantage of minimizing the number of binary comparisons needed and guarding against errors due to metastability of the comparator when the input signal is very close to some RAMP values. Gray code can be decoded simply by XORing the bits (no table lookup needed). However, the number of comparisons needed for each bit varies significantly. For example, in an N-bit Gray code, the leftmost bit demands only one comparison, while the rightmost bit demands $2^N-1$ comparisons. Such unevenness can complicate timing control and result in varying output rate of the bit-planes. We now present some unit-distance codes which divide the number of comparisons evenly across all bit positions. Tables 2, 3, 4, and 5 in the Appendix list such codes at various bit-resolutions. For example, for N=4 bits, shown in Table 4, the leftmost bit requires 3 comparisons, the second leftmost bit requires 4 comparisons, the second rightmost bit requires 4 comparisons and the rightmost bit requires 4 comparisons. This is as evenly distributed as possible.

Note that each code can be trivially varied by either barrel-shifting/cycling the code-words or by permuting the bits. For example, for N=2 shown in Table 2, unit-distance code 0-1-3-2 (in digital notation) can be barrel-shifted into 2-0-1-3, and the same code can become 0-2-3-1 by permuting the two bits. Table 6 tabulates all 8 codes based on 0-1-3-2. It is easy to show that this trivial redundancy factor is $2^N \times N!$, where N is the number of bits. We have listed 'distinct' codes only in Tables 2, 3, 4, and 5.

The advantage of such 'Evenly Distributed Number of Comparison' codes is that timing control for all bit positions are almost the same and the output rate of the bit-planes is constant. This advantage can be nicely exploited when multiple comparators per channel are used to speed up the ADC 10. The implementation of such multi-comparator speedup will be discussed in detail in the next subsection.

When compared with Gray code, the disadvantage of using 'Evenly Distributed Number of Comparison' code is that decoding requires a lookup table.

Depending on trade-offs of a particular application, either Gray-code or 'Evenly Distributed Number of Comparison' codes can be used in the MCBS ADC 10.

Speedup By Asking Multiple Questions Simultaneously

Figure 3:
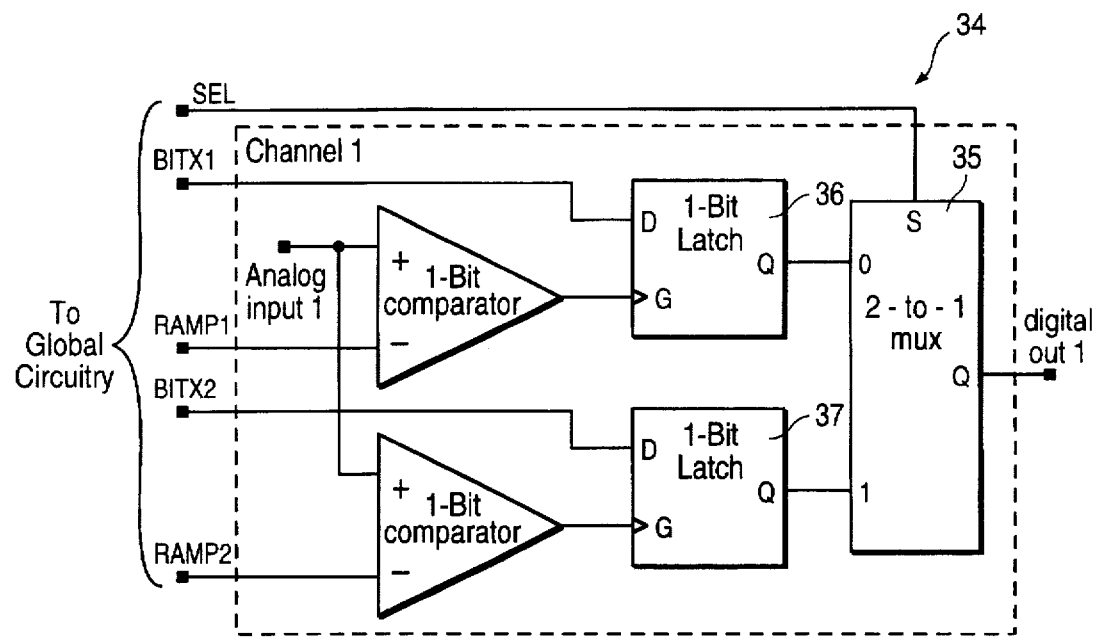
FIG. 3 illustrates an embodiment of a channel portion of an A/D converter wherein two pairs of comparators/latches are associated with a single analog input.

As mentioned in the previous subsection, the conversion speed of the MCBS ADC 10 can be increased by asking multiple questions simultaneously. This is achieved by using multiple comparator/latch pairs in the ADC 34 of FIG. 3. FIG. 3 depicts a single channel that uses two comparator/latch pairs. Here we have placed a 2-to-1 digital mux 35 at the output of the latches 36–37 so that the digital output is still 1-bit. This mux 35 may be omitted. Just like before, a multi-channel ADC employing the techniques of ADC 34 is composed of an array of the single channels and some control circuitry shared by all channels.

The operation of the channel works as follows: two questions can be independently asked simultaneously by the two comparator/latch pairs through signals RAMP1 and RAMP2. For example, if we use Gray code in MCBS ADC 34, then one comparator/latch pair is used to resolve the rightmost bit ($2^N-1$ comparisons) while the other comparator pair is used to serially resolve all the other bits (a total of $2^{N-1}-1$ comparisons). The speedup factor here is two because conversion time is the time it takes to make $2^{N-1}$ comparisons instead of the original $2^N-1$ comparisons. We see that for Gray code, the maximum speedup factor is two, and this is achieved by using just two comparator/latch pairs. More comparator/latch pairs do not gain any further speedup because resolving the rightmost bit takes $2^{N-1}$ comparisons. However, if we use the 'Evenly Distributed Number of Comparison' code, then each question demands $2^N/N$ comparisons, and we can use up to N comparator/latch pairs for a maximum speedup factor of N, where N is the number of bits. The digital output signal readout time is assumed to be insignificant when compared to the A/D conversion time.

Speedup By Asking A Question With Multiple Comparators

Figure 4:
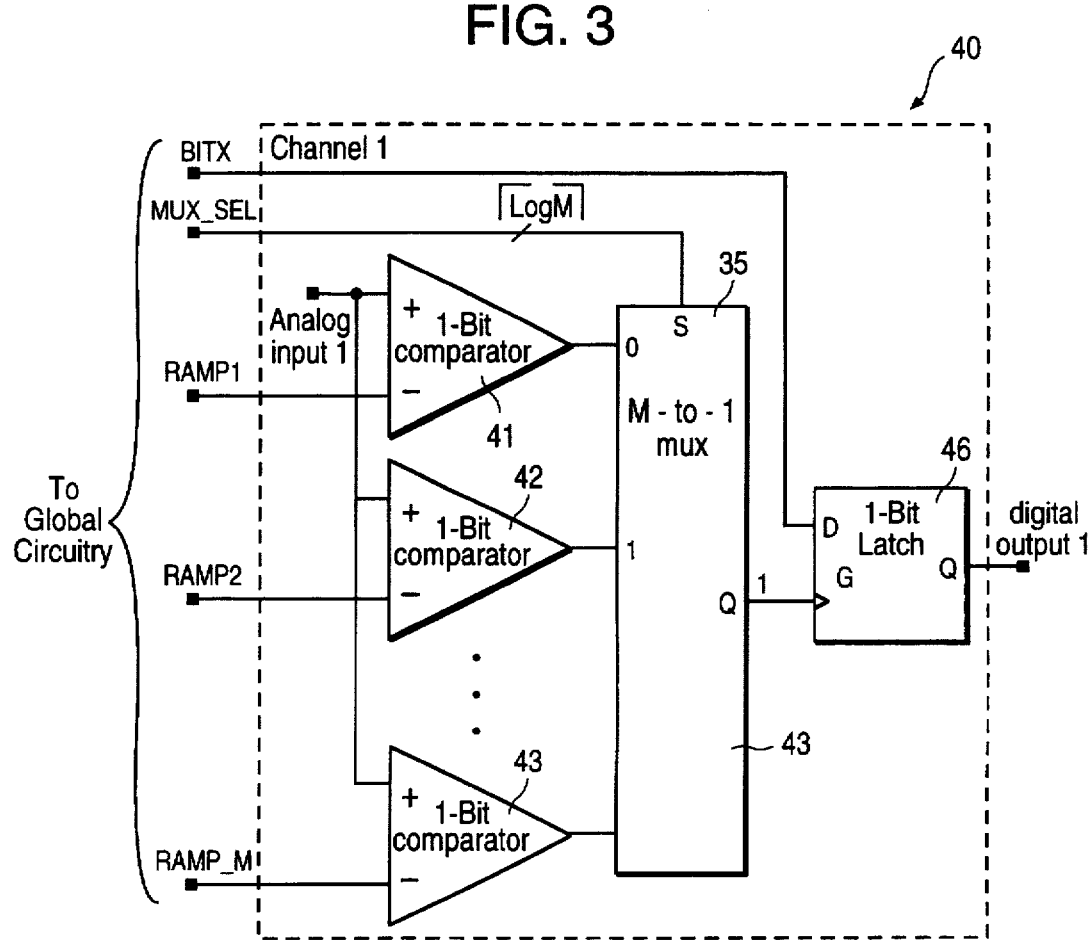
FIG. 4 illustrates an embodiment of a channel portion of an A/D converter wherein a plurality of comparators and a single latch are associated with a single analog input.

We present another scheme that can achieve even better speedup than the scheme discussed in the previous subsection. In this scheme, speedup is achieved because each question is asked by multiple comparators in a pipelined fashion. FIG. 4 illustrates a single channel of an ADC 40 that uses M comparators 41–43 to ask a single question. The single channel consists of M comparators 41–43, an M-to-1 digital mux 44 and a 1-bit latch 46.

As described previously, the MCBS ADC in accordance with our invention implements each binary question by performing a set of binary comparisons between the signal RAMP and the analog input. The set of RAMP values for bit position k is an ordered set of values. In the scheme shown in FIG. 4, since M comparators are used to ask the binary question, the set of RAMP values are divided among the comparators. Comparator 1 gets the first, the (M+1)th, the (2 M+1)th, ... values of the set; comparator 2 gets the second, the (M+2)th, the (2 M+2)th, ... values of the set; comparator M gets the Mth, (2 M)th, (3 M)th ... values of the set.

We will illustrate the order of comparison by an example. In the N=3 example described with respect to FIG. 2, the set of RAMP values for the bit0 are ⅛, ⅜, ⅝, and ⅞. Suppose we have only two comparators 41 and 42 (M=2), shown in FIG. 4, then comparator 41 gets ⅛ and ⅝, and comparator 42 gets ⅜ and ⅞. Conceptually, those values are compared with the analog input signal in monotonic order. To begin, comparator 41 compares the analog input with ⅛ via signal RAMP1, while comparator 42 compares the input with ⅜ via signal RAMP2; the output of comparator 41 is first sent to the 1-bit latch 46 through the 2-to-1 mux 44, and the output of comparator 42 is then sent to the 1-bit latch 46. Then comparator 41 compares the input with ⅝, and comparator 42 compares the input with ⅞. To avoid waiting for the mux 44 readout, the two comparators can work in an interleaved pipelined fashion. This means the comparator 41 starts first and, halfway through the comparison, comparator 42 starts, and then halfway through its comparison, comparator 41's output is sent to the 1-bit latch 46, and then it starts a new comparison. This ping-pong technique, in other forms, is known for speeding up ADCs.

We see that for a channel that uses M comparators, the speedup factor is about M, since each question takes 1/Mth the time to resolve.

As a note on implementation, when the ADC is implemented in a CMOS process, and if the muxes are simply made of pass transistors, then the extra delay due to the capacitance at the input of the latch can be a significant portion of the comparison time. In that case, this bounds the speedup factor to no more than the ratio of the total comparison time to the extra delay time. Even so, significant speedup can be achieved with the scheme described in this subsection. The ADC may be fabricated using any type of process.

Generalization To Multi-Bit Comparators

Figure 5:
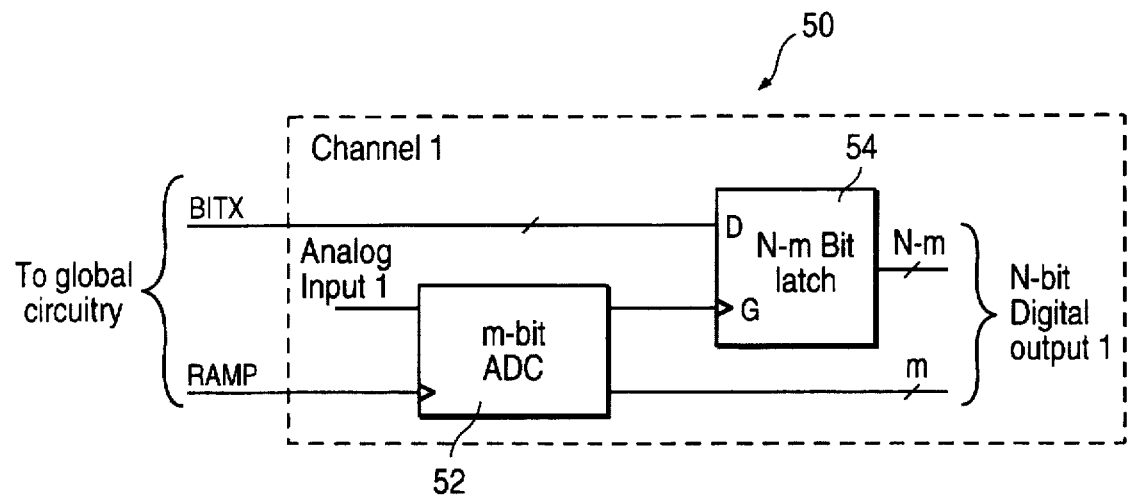
FIG. 5 illustrates an embodiment of a channel portion of an A/D converter wherein a coarse A/D converter associated with a specific channel provides a coarse conversion of the analog input, and the remainder of the channel uses successive comparisons to generate the remainder of the output bits.

One desirable aspect of the MCBS ADC of this invention is the use of monotonic RAMP values. This monotonicity ensures that each channel latches its answer to a question without extra control circuitry. The same principle can be applied in ADCs that use coarse m-bit ADCs. FIG. 5 describes a single channel of an ADC 50 that uses a coarse m-bit ADC 52 and an N-m bit latch 54. The m-bit ADC 52 has a 'slidable' input range which starts at whatever the RAMP signal is. Signal RAMP will step from 0, $2^m$, $2^{m+1}$, ..., to $2^N$. BITX is now an N-m bit signal, and its value gets latched when the overflow signal of the coarse ADC 52 becomes active. The conversion time is $2^{n-m}$ times the time it takes for a 'flash' of the coarse ADC 52. Unlike the MCBS ADC, all bits of the channel output become available at the same time. In the limiting case when the coarse ADC is N-bit (m=N), then a single channel simply becomes a counter-ramp ADC, and then the whole ADC simply consists of many identical counter-ramp ADCs.

MCBS ADC That Performs Non-Uniform Quantization And/Or Analog Pre-processing Before A/D Conversion We have presented examples of MCBS ADCs that perform A/D conversion with uniform quantization steps. The same MCBS ADC can perform non-uniform quantization. In addition, it can also perform analog pre-processing such as logarithmic compression or gamma correction. All these functions are achieved by choosing the right comparison values for the signal RAMP. In the remainder of this subsection, we will explain the general concepts underlying quantization coding and how the MCBS ADC performs non-uniform quantization and analog pre-processing.

Quantization coding can be divided into encoding and decoding. The ADC input range is partitioned into a disjoint set of intervals calls Voronoi cells, and those intervals are indexed. Each interval is also represented by an output number, typically the interval's centroid. Encoding is finding the index of the interval to which the analog input belongs; decoding is simply looking up the number associated with the interval. This decoded number is the quantized value of the analog input. A properly designed quantization code should minimize the average quantization error (e.g. mean square error). Many algorithms have been developed for finding optimal quantization partitions and the decoder outputs. For example, Lloyd-Max algorithm is one of the most popular quantization coding algorithms.

An ADC performs only the encoding part of quantization, i.e., finding the index of the interval to which the analog input belongs. Our MCBS ADC can perform encoding based on any quantization partition. The operation procedure is identical to that described with respect to FIG. 2. Although the unit interval is still partitioned into $2^N$ subintervals, these subintervals may not be of equal size as in uniform quantization. If we denote the boundary values of those subintervals by 0, $r_0, r_1, \ldots r_{2^N-1}$, 1, then the set of RAMP values is $\{r_0, r_1, \ldots r_{2^N-1}\}$. Since our MCBS ADC can use any quantization code by simply using the corresponding RAMP signal values, this allows MCBS ADC to perform adaptive A/D conversion based on the input statistics. This is important because many quantization codes are derived based on some assumed input statistics, and sometimes those statistics can change over time. We only need to add some circuitry that computes the input statistics and dynamically compute the quantization code and adjust MCBS ADC via the RAMP signal.

Figure 6:
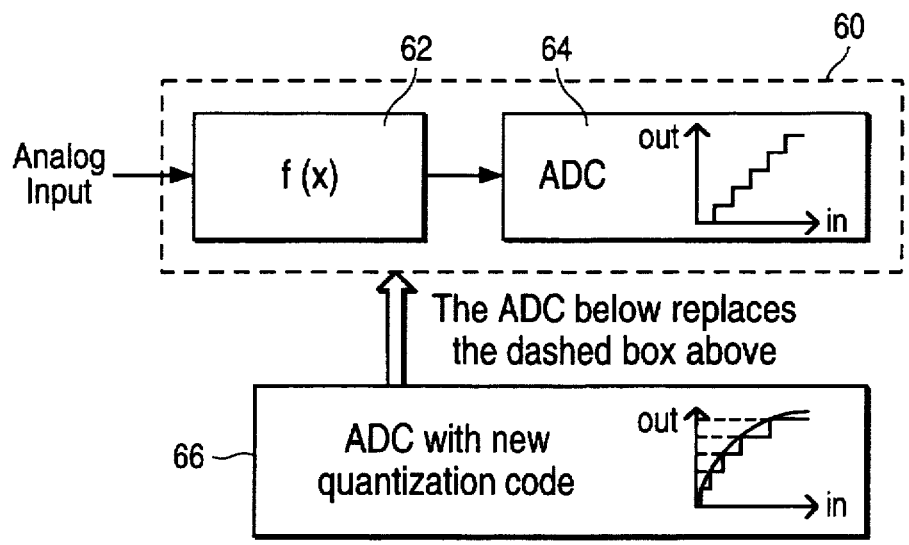
FIG. 6 illustrates the lack of any need for pre-processing circuitry prior to any A/D conversion using the present invention.

We have just described how MCBS performs A/D conversion based on any quantization code. Any analog pre-processing before the A/D conversion may be performed without any additional circuitry. This is achieved by adjusting quantization code/partitions via the RAMP signal. In FIG. 6, the top dashed box 60 encloses the analog pre-processing f(x) 62 followed by quantization by ADC 64. The pre-processing and quantization can be merged into one quantization step by using a new quantization code/partition 66. The pre-processing function f(x) 62 can be any continuous or piecewise continuous function; however, it is particularly simple if f(x) is a continuous and monotonic function. We will first describe how to implement a continuous and monotonic f(x), and then will describe the implementation for general piecewise continuous functions.

Figure 7:
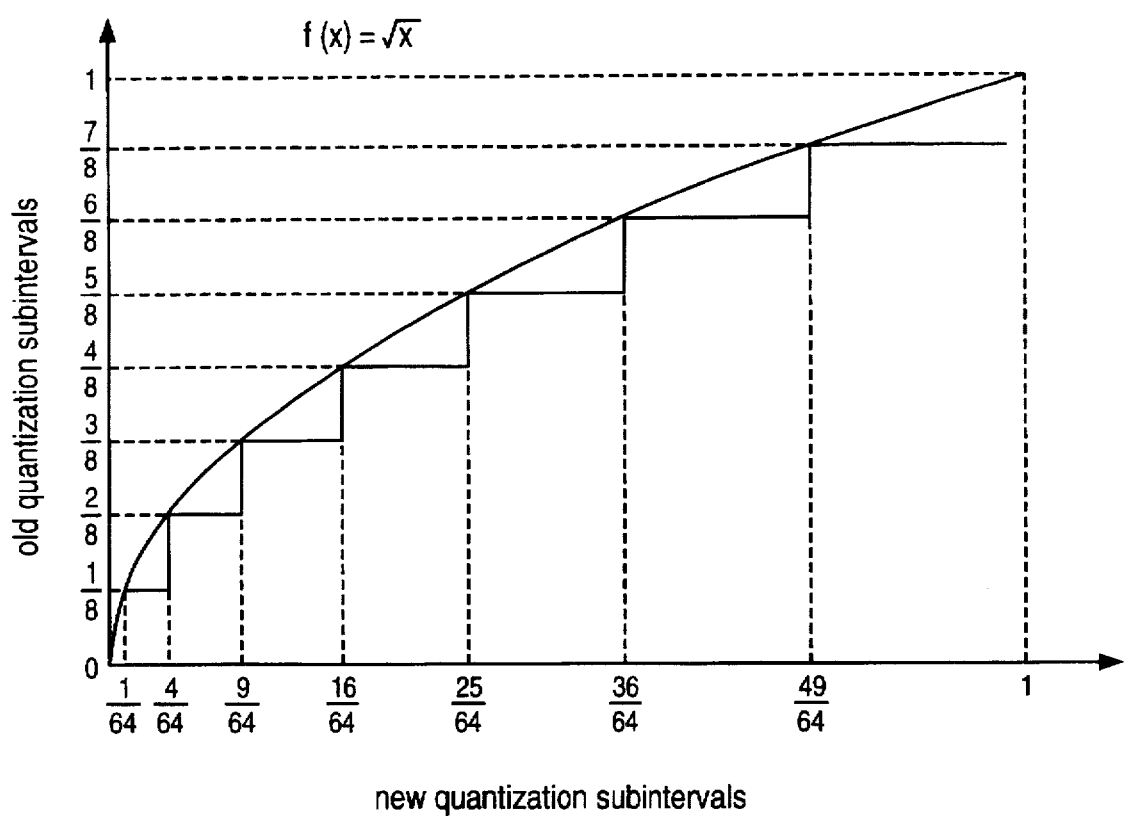
FIG. 7 illustrates how new quantization subintervals may be employed to provide pre-processing.

Without loss of generality, the pre-processing function f(x) 62 is assumed to be a piecewise continuous mapping from [0,1] to [0,1]. Suppose that f(x) is a monotonic function, then it can be shown that f(x) is invertible. As described earlier, the MCBS ADC performs quantization by asking questions of the form: Is signal S ∈A ?, where A is a subset of the set of the partition subintervals. With pre-processing, the question becomes: Is signal f(x) ∈A? or equivalently: Is signal x ∈$f^{-1}$ (A) ? where $f^{-1}$ denotes the inverse of f. We see that the analog pre-processing can be achieved simply by using the inverted image of the quantization subintervals. Since f(x) is monotonic, the order of the subintervals are preserved. For example, suppose f(x)=$\sqrt{X}$ and it is followed by uniform 3-bit quantization. FIG. 7 shows the old quantization subintervals vs. the new quantization subintervals. We see that the new RAMP values are $$\left\{ \frac{1}{64}, \frac{4}{64}, \frac{9}{64}, \frac{16}{64}, \frac{25}{64}, \frac{36}{64}, \frac{49}{64} \right\},$$

and they are computed by $f^{-1}$ (x)=$x^2$. By using the new quantization values, the MCBS ADC performs analog square-root function and uniform quantization in one step. In the same fashion, many important pre-processing functions such as logarithmic compressing (e.g., A-law or μ-law) or Gamma correction can be performed.

When the desired pre-processing function f(x) is not monotonic, the MCBS ADC can still perform analog pre-processing by using the corresponding quantization partitions; however, the number of partitions/subintervals may be larger than that of the original and so disjoint subintervals may be assigned the same index/code. Just as in the monotonic case, we derive the new quantization partitions by using the inverse $f^{-1}$(x). Unlike the monotonic case, the inverse here denotes the inverse image instead of the inverse function, which may not exist (i.e., the inverse image consists of all values of y such that f(y)=x). So it is possible that a subinterval's inverse image is a disjoint set of subintervals, but such a set of subintervals is still assigned one index only, namely the same index of the original subinterval. The coding of the indices remains the same and it still possesses unit-distance property because f(x) is continuous.

Analog pre-processing can also be performed together with vector quantization for a set of signals. For example, analog signals from a plurality of pixels may be added, averaged, subtracted, or a maximum determined prior to processing the data using the ADC. Additionally, different analog signals applied to the ADC may be converted to digital values using different quantization steps for each analog input. The DAC 18, for example, in FIG. 1A may be programmable to provide different quantization levels for different analog inputs.

In short, in this subsection we have shown how our MCBS ADC performs ADC with any quantization codes and how MCBS ADC performs any analog pre-processing f(x) followed by quantization.

MCBS ADC For CMOS Area Image Sensors

The MCBS Nyquist rate ADC is best suited for performing ADC in a CMOS area image sensor at the pixel level or where the ADC is multiplexed among a group of neighboring pixels. This not only retains all the advantages of pixel A/D conversion, such as small circuit area and robust circuitry, but also overcomes the problem of generating too much data from oversampled A/D conversion techniques.

We will first describe an implementation of an image sensor pixel cell with an MCBS ADC formed using a standard digital CMOS process.

Figure 8:
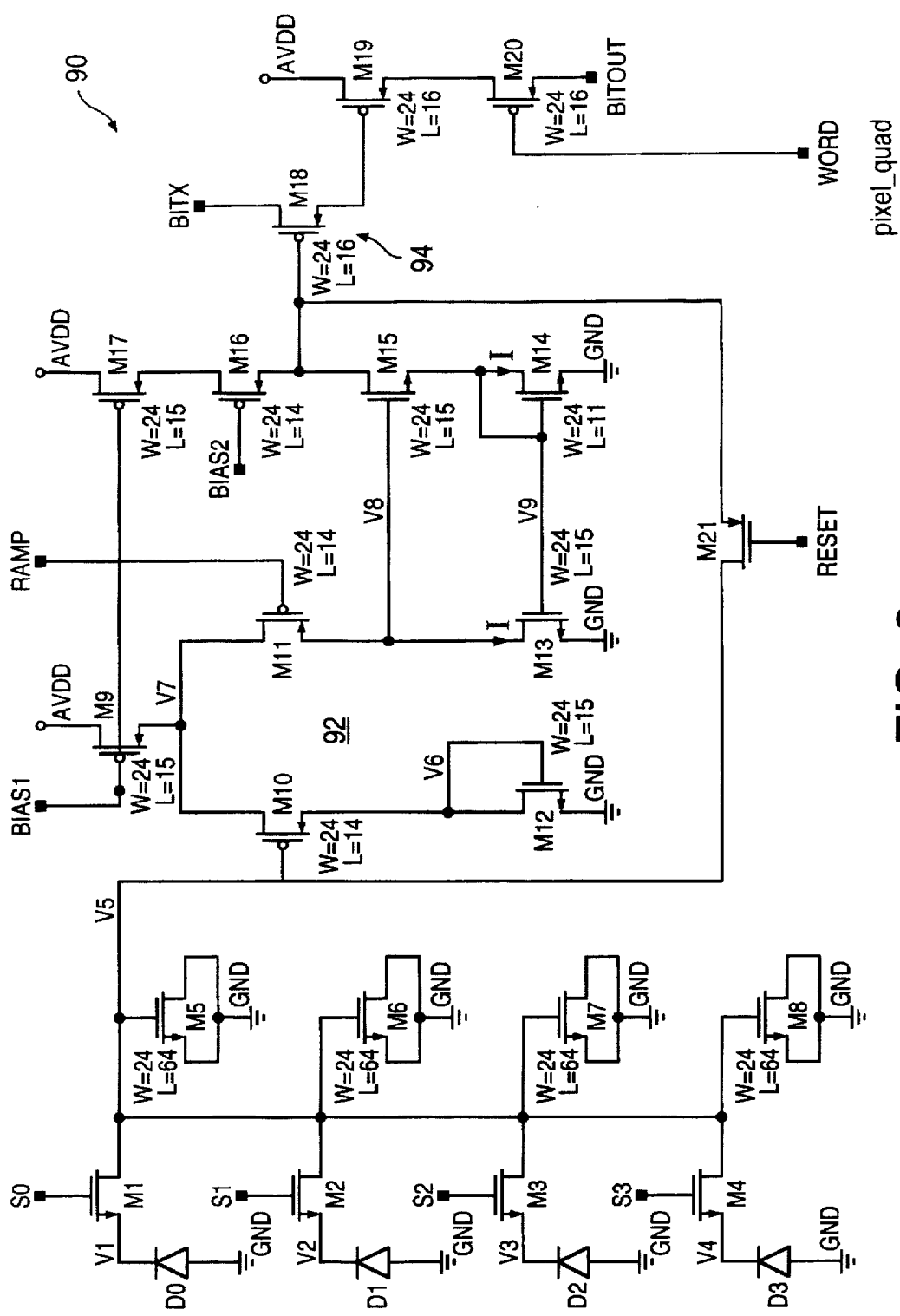
FIG. 8 illustrates circuitry within an image sensor array where a comparator and latch in an A/D converter are associated with four photodetectors in the image sensor array, with the global circuitry being located outside of the array.

A schematic of the pixel level circuit of an MCBS ADC 90 is shown in FIG. 8. Each pixel contains a photodiode D0–D3 as a photodetector. MOS transistors M5–M8 are used as capacitors to integrate the photodetector signals. Each photodetector is sampled in sequence by sampling signals S0–S3. The ADC 90 circuitry is shared among four nearest neighbor pixels. The ADC consists of a comparator 92 and a one bit dynamic latch 94. The comparator consists of a transconductance stage and a cascode amplifier stage. It is biased under subthreshold to maximize gain and minimize power. The dynamic latch 94 acts as a 2T DRAM cell where MOS M18 is the pass transistor (write port) and M19 is the output buffer (read port). Transistor M20 is an access transistor. Offset correction and correlated double sampling is achieved through auto zeroing, where the offset values are stored on the photodiode by briefly turning on a feedback path via reset transistor M21. This ADC 90 uses 21 transistors for four pixels, resulting in an average of four transistors/pixel.

Note that the particular implementation (e.g., CMOS) of the ADC determines whether the various inputs are inverting or non-inverting. However, the functions performed by the various components of the ADC are the same for all implementations.

Figure 9:
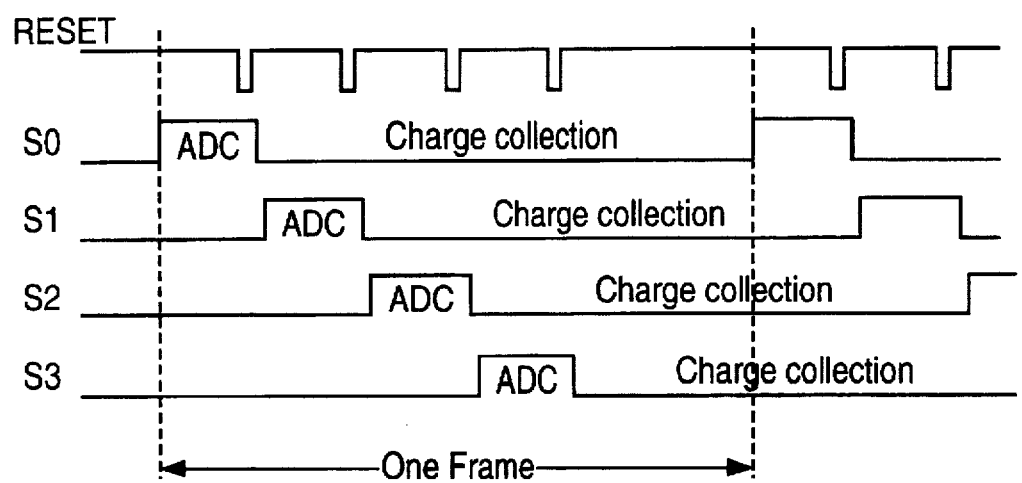
FIG. 9 illustrates the sampling of the photodetector signals during a single frame.

FIG. 9 depicts the waveforms of the control signals used to generate a frame of an image. Because of multiplexing, four quarter frames of an image are generated to compose one frame.

Figure 10:
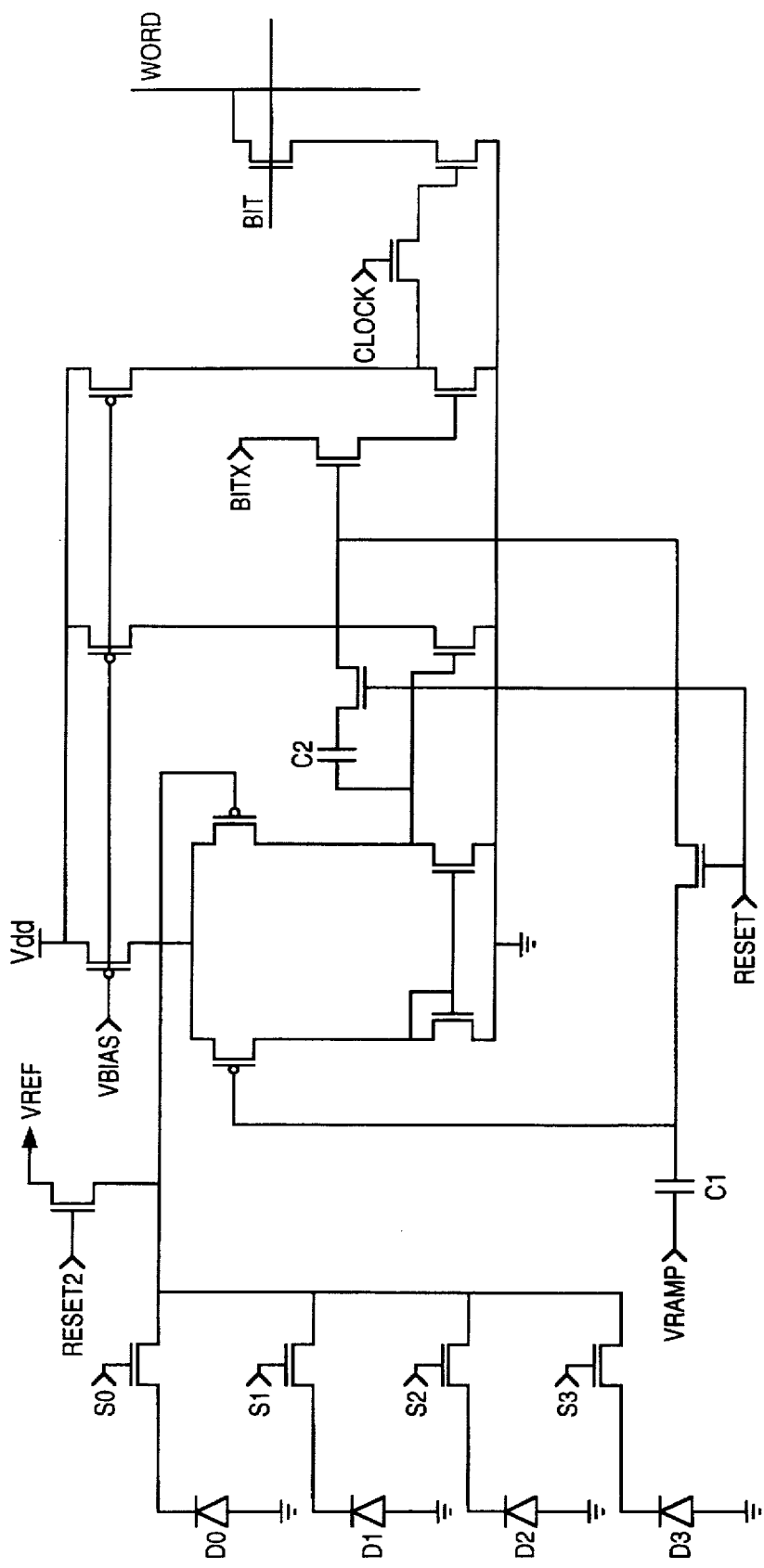
FIG. 10 is a modification of the schematic diagram of FIG. 8 where a comparator is formed in two stages.

Another possible implementation of the comparator 92 uses the classical two-stage topology and its schematic is shown in FIG. 10. Also, the offset correction circuitry can be removed if external digital correction is employed.

One feature of our MCBS ADC when used in an image sensor is that most of the complex circuitry is shared among all pixels, and hence nonuniformity of pixels caused by the ADC comes from only two places: variation in analog switching feed through and comparator offset. They are further reduced using any offset correction technique, for example, autozeroing.

Figure 11:
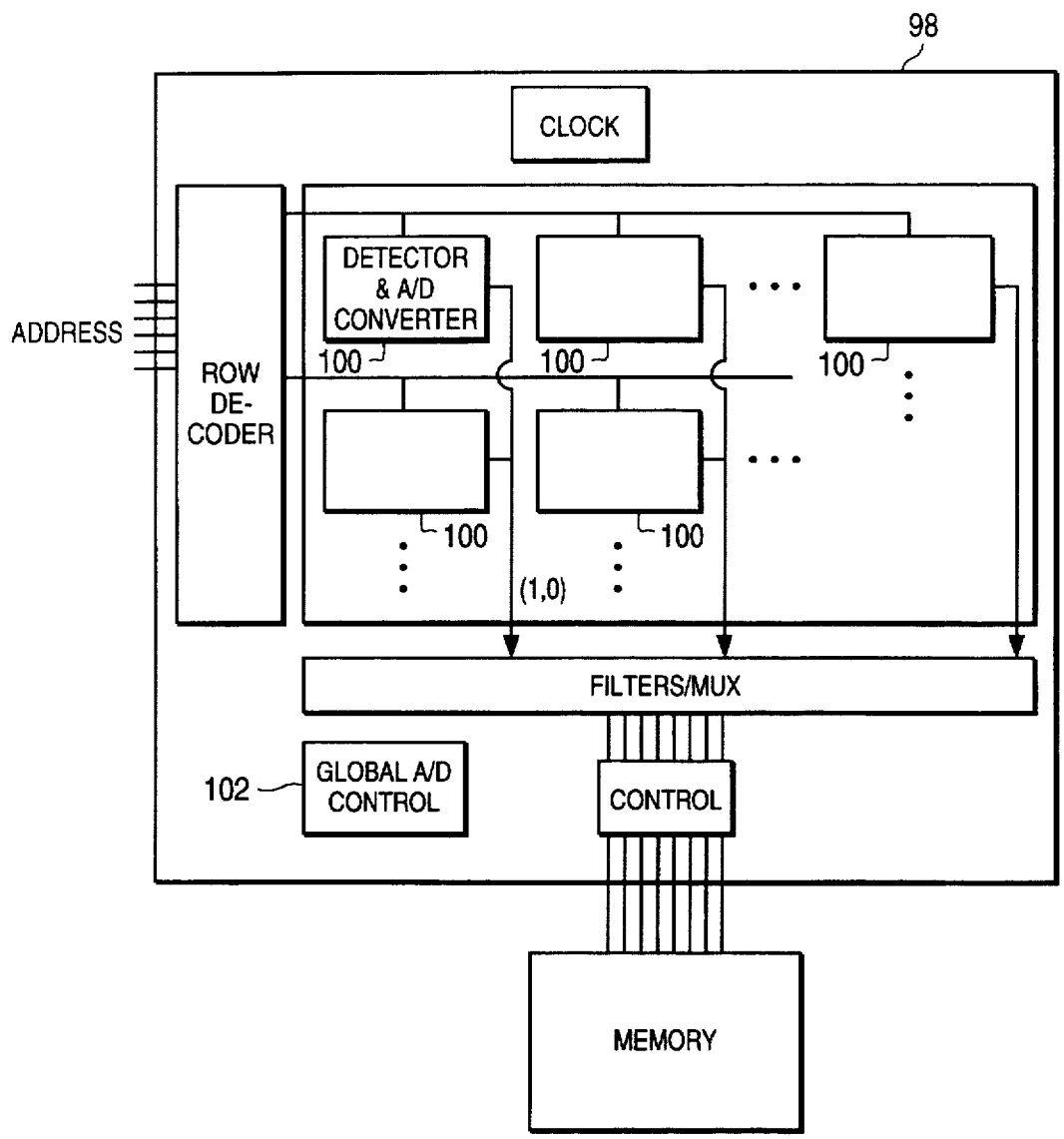
FIG. 11 illustrates an image sensor formed as an integrated circuit where the channel specific portion of the A/D converter is located proximate to associated photodetectors in the image sensor array.

A block diagram of an integrated circuit 98 containing an image sensor having pixel level ADCs in the image sensor core is shown in FIG. 11. FIG. 11 is identical to FIG. 1 in U.S. Pat. No. 5,461,425, but the ADCs in block 100, described in U.S. Pat. No. 5,461,425, are replaced with the ADCs described herein, and a global circuitry block 102 is added for controlling the pixel level ADC portions in blocks 100. The description of FIG. 1 in U.S. Pat. No. 5,461,425 is incorporated herein by reference and will not be repeated. A single ADC may be shared among a group of pixels.

Figure 12:
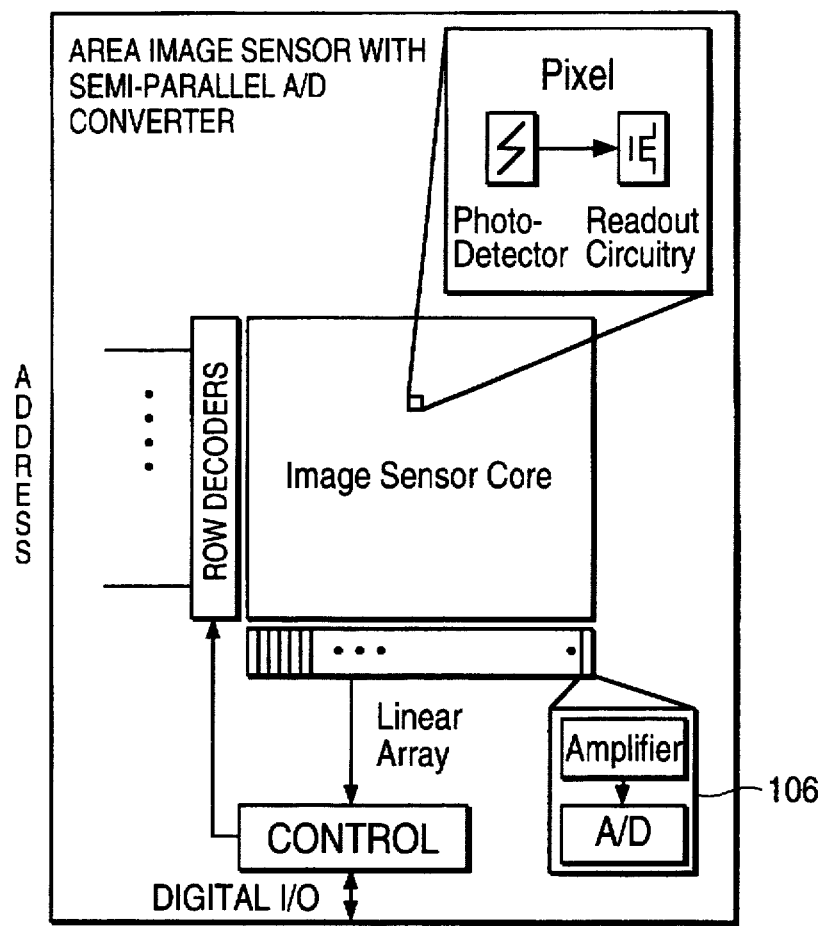
FIG. 12 illustrates an image sensor formed as an integrated circuit where each column of photodetectors is associated with a single A/D converter, formed in accordance with this invention, located external to the image sensor array.

Although we have discussed the MCBS ADC in the context of pixel level ADC, it can also be used in column level ADC, where the ADC is not located within the image sensor core. The only difficulty with this approach is the switching speed required by the comparator. At high video frame rates, the comparator in the MCBS ADC must be very fast in order to keep up with the data. This is not a concern for still imaging or low frame rate video imaging. This approach is illustrated in FIG. 12. Each column of photodetectors applies its analog value to an associated ADC 106 formed in accordance with the present invention. The rows and columns of photodetectors are addressed to provide digital values of the photodetector outputs at terminals of the integrated circuit. The remainder of the image sensor may be similar to that described in U.S. Pat. No. 5,461,425.

The A/D converter techniques described herein will allow 10 bit per pixel resolution at frame rates over 60 Hz. Higher resolutions are possible using state of the art integrated circuit processing techniques.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

TABLE 2

2-Bit MCBS ADC 'Evenly Distributed Number of Comparison' Code
2-Bit MCBS ADC 'Evenly Distributed Number of Comparison' Code

| D/A Converter Input | Code | In digital notation |
|---|---|---|
| 0–¼ | 00 | 0 |
| ¼–²⁄₄ | 01 | 1 |
| ²⁄₄–¾ | 11 | 3 |
| ¾–1 | 10 | 2 |
| number of comparison | 12 | |

TABLE 3

3-Bit MCBS ADC 'Evenly Distributed Number of Comparison' Code
3-Bit MCBS ADC 'Even Number of Comparison' Code

| D/A Converter Input | Code | In digital notation |
|---|---|---|
| 0–⅛ | 000 | 0 |
| ⅛–²⁄₈ | 001 | 1 |
| ²⁄₈–⅜ | 011 | 3 |
| ⅜–⁴⁄₈ | 111 | 7 |
| ⁴⁄₈–⅝ | 101 | 5 |
| ⅝–⁶⁄₈ | 100 | 4 |
| ⁶⁄₈–⅞ | 110 | 6 |
| ⅞–1 | 010 | 2 |
| number of comparisons | 232 | |

TABLE 4

4-Bit MCBS ADC 'Evenly Distributed Number of Comparison' Code
4-Bit MCBS ADC 'Evenly Distributed Number of Comparison' Code

| D/A Converter Input | Code | In digital notation |
|---|---|---|
| 0–¹⁄₁₆ | 0000 | 0 |
| ¹⁄₁₆–²⁄₁₆ | 0001 | 1 |
| ²⁄₁₆–³⁄₁₆ | 0011 | 3 |
| ³⁄₁₆–⁴⁄₁₆ | 0010 | 2 |
| ⁴⁄₁₆–⁵⁄₁₆ | 0110 | 6 |
| ⁵⁄₁₆–⁶⁄₁₆ | 0100 | 4 |
| ⁶⁄₁₆–⁷⁄₁₆ | 1100 | 12 |
| ⁷⁄₁₆–⁸⁄₁₆ | 1110 | 14 |
| ⁸⁄₁₆–⁹⁄₁₆ | 1010 | 10 |
| ⁹⁄₁₆–¹⁰⁄₁₆ | 1011 | 11 |
| ¹⁰⁄₁₆–¹¹⁄₁₆ | 1111 | 1 |
| ¹¹⁄₁₆–¹²⁄₁₆ | 0111 | 7 |
| ¹²⁄₁₆–¹³⁄₁₆ | 0101 | 5 |

TABLE 4-continued

4-Bit MCBS ADC 'Evenly Distributed Number of Comparison' Code
4-Bit MCBS ADC 'Evenly Distributed Number of Comparison' Code

| D/A Converter Input | Code | In digital notation |
|---|---|---|
| ¹³⁄₁₆–¹⁴⁄₁₆ | 1101 | 13 |
| ¹⁴⁄₁₆–¹⁵⁄₁₆ | 1001 | 9 |
| ¹⁵⁄₁₆–1 | 1000 | 8 |
| number of comparisons | 3444 | |

TABLE 5

5-Bit MCBS ADC 'Evenly Distributed Number of Comparison' Code
5-Bit MCBS ADC 'Evenly Distributed Number of Comparison' Code

| DAC Input | Code | In digital notation |
|---|---|---|
| 0–¹⁄₃₂ | 00000 | 0 |
| ¹⁄₃₂–²⁄₃₂ | 00001 | 1 |
| ²⁄₃₂–³⁄₃₂ | 00011 | 3 |
| ³⁄₃₂–⁴⁄₃₂ | 00010 | 2 |
| ⁴⁄₃₂–⁵⁄₃₂ | 00110 | 6 |
| ⁵⁄₃₂–⁶⁄₃₂ | 00100 | 4 |
| ⁶⁄₃₂–⁷⁄₃₂ | 00101 | 5 |
| ⁷⁄₃₂–⁸⁄₃₂ | 00111 | 7 |
| ⁸⁄₃₂–⁹⁄₃₂ | 01111 | 15 |
| ⁹⁄₃₂–¹⁰⁄₃₂ | 01011 | 11 |
| ¹⁰⁄₃₂–¹¹⁄₃₂ | 01001 | 9 |
| ¹¹⁄₃₂–¹²⁄₃₂ | 11001 | 25 |
| ¹²⁄₃₂–¹³⁄₃₂ | 10001 | 17 |
| ¹³⁄₃₂–¹⁴⁄₃₂ | 10000 | 16 |
| ¹⁴⁄₃₂–¹⁵⁄₃₂ | 10100 | 20 |
| ¹⁵⁄₃₂–¹⁶⁄₃₂ | 10110 | 22 |
| ¹⁶⁄₃₂–¹⁷⁄₃₂ | 11110 | 30 |
| ¹⁷⁄₃₂–¹⁸⁄₃₂ | 01110 | 14 |
| ¹⁸⁄₃₂–¹⁹⁄₃₂ | 01010 | 10 |
| ¹⁹⁄₃₂–²⁰⁄₃₂ | 11010 | 26 |
| ²⁰⁄₃₂–²¹⁄₃₂ | 10010 | 18 |
| ²¹⁄₃₂–²²⁄₃₂ | 10011 | 19 |
| ²²⁄₃₂–²³⁄₃₂ | 11011 | 27 |
| ²³⁄₃₂–²⁴⁄₃₂ | 11111 | 31 |
| ²⁴⁄₃₂–²⁵⁄₃₂ | 10111 | 23 |
| ²⁵⁄₃₂–²⁶⁄₃₂ | 10101 | 21 |
| ²⁶⁄₃₂–²⁷⁄₃₂ | 11101 | 29 |
| ²⁷⁄₃₂–²⁸⁄₃₂ | 01101 | 13 |
| ²⁸⁄₃₂–²⁹⁄₃₂ | 01100 | 12 |
| ²⁹⁄₃₂–³⁰⁄₃₂ | 11100 | 28 |
| ³⁰⁄₃₂–³¹⁄₃₂ | 11000 | 24 |
| ³¹⁄₃₂–1 | 01000 | 8 |
| number of comparisons | 67666 | |

TABLE 6

Code 0-1-3-2 and its 7 trivial variations
2-Bit MCBS ADC Unit-distance Code

| DAC Input | Code | variation | variation | variation | variation | variation | variation | variation |
|---|---|---|---|---|---|---|---|---|
| 0–¼ | 00 | 10 | 11 | 01 | 00 | 01 | 11 | 10 |
| ¼–½ | 01 | 00 | 10 | 11 | 10 | 00 | 01 | 11 |
| ½–¾ | 11 | 01 | 00 | 10 | 21 | 10 | 00 | 01 |
| ¾–1 | 10 | 11 | 01 | 00 | 01 | 11 | 10 | 00 |

What is claimed is:

1. A circuit comprising:
   an analog-to-digital (A/D) converter comprising:
   a first signal generator for generating a first signal having a plurality of levels;
   a comparator having a first input connected to receive said first signal, said comparator having a second input connected to receive an analog input to be converted into a digital value;
   a binary signal generator for generating a series of binary signals; and
   a latch having a first input coupled to receive an output of said comparator, said latch having a data input coupled to receive said binary signals, an output of said comparator controlling when said latch provides an output signal corresponding to a signal applied to said data input,
   wherein said latch provides at least a portion of an N-bit digital code representing said analog input applied to said second input of said comparator.

2. The circuit of claim 1 wherein said N-bit digital code is a Gray code.

3. The circuit of claim 1 wherein said A/D converter performs $2^N-1$ comparisons to generate said N-bit digital code.

4. The circuit of claim 1 wherein N is greater than or equal to 3.

5. The circuit of claim 1 further comprising a sampling circuit connected to an output of said latch for outputting said output of said latch at an end of a bit time associated with a bit position of said N-bit digital code.

6. The circuit of claim 1 wherein said first signal generator generates a series of binary codes representing analog levels, said circuit further comprising a digital-to-analog converter connected to receive said binary codes, an output of said digital-to-analog converter being connected to said first input of said comparator.

7. The circuit of claim 1 wherein said first signal generator generates an analog ramped signal for each bit of said N-bit digital code.

8. The circuit of claim 1 further comprising:
   a plurality of comparators, wherein said comparator is one of said plurality of comparators, each of said comparators receiving the same analog input and each of said comparators receiving a different signal having a plurality of levels;
   a plurality of latches, wherein said latch is one of said plurality of latches, each of said latches having a first input coupled to an output of a respective one of said comparators, each of said latches having a data input coupled to receive a different series of said binary signals, wherein each of said latches provides a digital signal representing part of said N-bit digital code; and
   a multiplexer having inputs connected to outputs of said latches, said multiplexer being controlled to output selected latch outputs so that an output of said multiplexer is a digital representation of said analog input.

9. The circuit of claim 1 further comprising:
   a plurality of comparators, wherein said comparator is one of said plurality of comparators, each of said comparators receiving the same analog input at a first input of each of said comparators, each of said comparators having a different signal having a plurality of levels applied to its respective second input; and
   a multiplexer, an output of each said comparators being applied to a respective input of said multiplexer, said multiplexer being controlled to selectively apply one of its inputs to a multiplexer output, said output of said multiplexer being applied to said latch.

10. The circuit of claim 1 wherein said first signal generator generates a series of binary codes that identify subintervals, said analog input falling within one of said subintervals for each N-bit digital code.

11. The circuit of claim 1 wherein said comparator forms a portion of a second analog-to-digital converter, said second analog-to-digital converter generating said binary signals for a portion of said N-bit digital code.

12. The circuit of claim 1 further comprising:
   an image sensor formed as an integrated circuit having a plurality of photodetectors, said photodetectors formed within an image sensor array, each of said photodetectors generating an analog signal, said comparator and said latch being formed within said image sensor array proximate to said photodetectors for converting an analog signal generated by at least one photodetector into a digital code,
   wherein said comparator is one of a plurality of comparators and said latch is one of a plurality of latches all formed within said image sensor array as part of a plurality of analog-to-digital converters.

13. The circuit of claim 12 wherein one comparator and one latch are assigned to each of said photodetectors.

14. The circuit of claim 12 wherein one comparator and one latch are associated with a group of photodetectors.

15. The circuit of claim 12 wherein a plurality of comparators are associated with one photodetector.

16. The circuit of claim 1 further comprising:
   an image sensor formed as an integrated circuit having a plurality of photodetectors, each of said photodetectors generating an analog signal, said photodetectors being formed with an image sensor array, and wherein said A/D converter is formed external to said image sensor array.

17. A method for performing analog-to-digital conversion comprising:

receiving a first signal having a plurality of levels;

comparing said first signal to an analog input to be converted into a digital value and outputting a comparison result;

receiving a series of binary signals; and applying said comparison result to a first input of a latch, and applying said series of binary signals to a data input of said latch, a logic level of said comparison result controlling when said latch provides an output signal corresponding to a signal applied to said data input, wherein said latch provides at least a portion of an N-bit digital code representing said analog input.

18. The method of claim 17 wherein said N-bit digital code is a Gray code.

19. The method of claim 17 wherein said analog-to-digital conversion performs $2^N-1$ comparisons to generate said N-bit digital code.

20. The method of claim 17 further comprising sampling an output of said latch at an end of a bit time associated with a bit position of said N-bit digital code.

* * * * *